1.

United States Patent
Hatanaka et al.

(10) Patent No.: US 10,903,754 B2
(45) Date of Patent: Jan. 26, 2021

(54) POWER CONVERTER

(71) Applicant: HITACHI AUTOMOTIVE SYSTEMS, LTD., Hitachinaka (JP)

(72) Inventors: Ayumu Hatanaka, Hitachinaka (JP); Takeshi Seki, Hitachinaka (JP); Kazushi Takahashi, Hitachinaka (JP); Kenji Ohshima, Hitachinaka (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 0 days.

(21) Appl. No.: 16/478,250

(22) PCT Filed: Dec. 19, 2017

(86) PCT No.: PCT/JP2017/045440
§ 371 (c)(1),
(2) Date: Jul. 16, 2019

(87) PCT Pub. No.: WO2018/135214
PCT Pub. Date: Jul. 26, 2018

(65) Prior Publication Data
US 2019/0356238 A1 Nov. 21, 2019

(30) Foreign Application Priority Data
Jan. 17, 2017 (JP) .................. 2017-005516

(51) Int. Cl.
*H01L 23/00* (2006.01)
*H02M 7/48* (2007.01)
(Continued)

(52) U.S. Cl.
CPC ............ *H02M 7/48* (2013.01); *H01L 23/473* (2013.01); *H01L 24/03* (2013.01); *H02M 7/003* (2013.01); *H02M 7/155* (2013.01)

(58) Field of Classification Search
CPC ............ H01L 23/473; H01L 23/49838; H01L 23/481; H01L 23/34; H01L 23/50;
(Continued)

(56) References Cited

U.S. PATENT DOCUMENTS 9,350,228 B2 * 5/2016 Uetake .................. H02M 7/003
2010/0288532 A1 11/2010 Ikeda
(Continued)

FOREIGN PATENT DOCUMENTS

JP 2005-130542 A 5/2005
JP 2010-267586 A 11/2010
(Continued)

OTHER PUBLICATIONS

International Search Report with English translation and Written Opinion issued in corresponding application No. PCT/JP2017/045440 dated Feb. 20, 2018.

*Primary Examiner* — Nikolay K Yushin
(74) *Attorney, Agent, or Firm* — Foley & Lardner LLP

(57) ABSTRACT

A problem to be solved by the present invention is to secure a creepage distance while maintaining miniaturization. A power converter according to the present invention includes a positive electrode side conductor, a negative electrode side conductor, and an insulating member disposed between the positive electrode side conductor and the negative electrode side conductor, in which the positive electrode side conductor or the negative electrode side conductor includes a main surface on a side opposite to a surface in contact with the insulating member, a side surface connected to the surface in contact with the insulating member, and an inclined surface forming an obtuse angle with respect to each of the main surface and the side surface, and the insulating member includes a protrusion formed so as to overlap with the side
(Continued)

surface and the inclined surface as viewed in a direction perpendicular to the side surface.

6 Claims, 6 Drawing Sheets

(51) Int. Cl.
    *H01L 23/473*     (2006.01)
    *H02M 7/00*     (2006.01)
    *H02M 7/155*     (2006.01)

(58) Field of Classification Search
    CPC ......... H01L 24/03; H01L 24/45; H01L 24/18;
              H01L 24/97; H02M 7/48; H02M 7/003;
                               H02M 7/155
    See application file for complete search history.

(56) References Cited

U.S. PATENT DOCUMENTS

2011/0308834 A1    12/2011   Takahashi
2014/0160823 A1*   6/2014   Uetake .................. H02M 7/003
                                                     363/141

FOREIGN PATENT DOCUMENTS

JP          2012-005300 A    1/2012
JP           2013-90529 A    5/2013

* cited by examiner

POWER CONVERTER

TECHNICAL FIELD

The present invention relates to a power converter, and more particularly to a power converter that supplies power to a motor for driving a vehicle.

BACKGROUND ART

PTL 1 and PTL 2 disclose a technique of securing a creepage distance of insulation compliant with international standards between a positive electrode side conductor and a negative electrode side conductor of a bus bar.

In PTL 1, the creepage distance is increased by projecting an insulation protrusion from a laminated conductor plate.

In PTL 2, the creepage distance is increased by subjecting a short edge of an insulating plate disposed between a positive electrode side conductor and a negative electrode side conductor of a bus bar to additional processing of a creeping groove portion.

On the other hand, miniaturization of a power converter is required. In other words, it is required to secure the creepage distance between conductors, while there has been a trend toward high integration in a power converter.

CITATION LIST

Patent Literature

PTL 1: JP 2005-130542 A
PTL 2: JP 2012-005300 A

SUMMARY OF INVENTION

Technical Problem

Therefore, the problem to be solved by the present invention is to secure the creepage distance while maintaining miniaturization.

Solution to Problem

A power converter according to the present invention includes a positive electrode side conductor, a negative electrode side conductor, and an insulating member disposed between the positive electrode side conductor and the negative electrode side conductor, in which the positive electrode side conductor or the negative electrode side conductor includes a main surface on a side opposite to a surface in contact with the insulating member, side surface connected to the surface in contact with the insulating member, and an inclined surface forming an obtuse angle with respect to each of the main surface and the side surface, and the insulating member includes a protrusion formed so as to overlap with the side surface and the inclined surface as viewed in a direction perpendicular to the side surface.

Advantageous Effects of Invention

According to the present invention, the creepage distance can be secured while maintaining miniaturization.

BRIEF DESCRIPTION OF DRAWINGS

FIG. 5($b$) is a conceptual view showing the completion of the PN bus bar 15 created by the manufacturing step of FIG. 5($a$).

DESCRIPTION OF EMBODIMENTS

An embodiment according to the present invention will be described with reference to FIGS. 1 to 5($b$).

Figure 2:
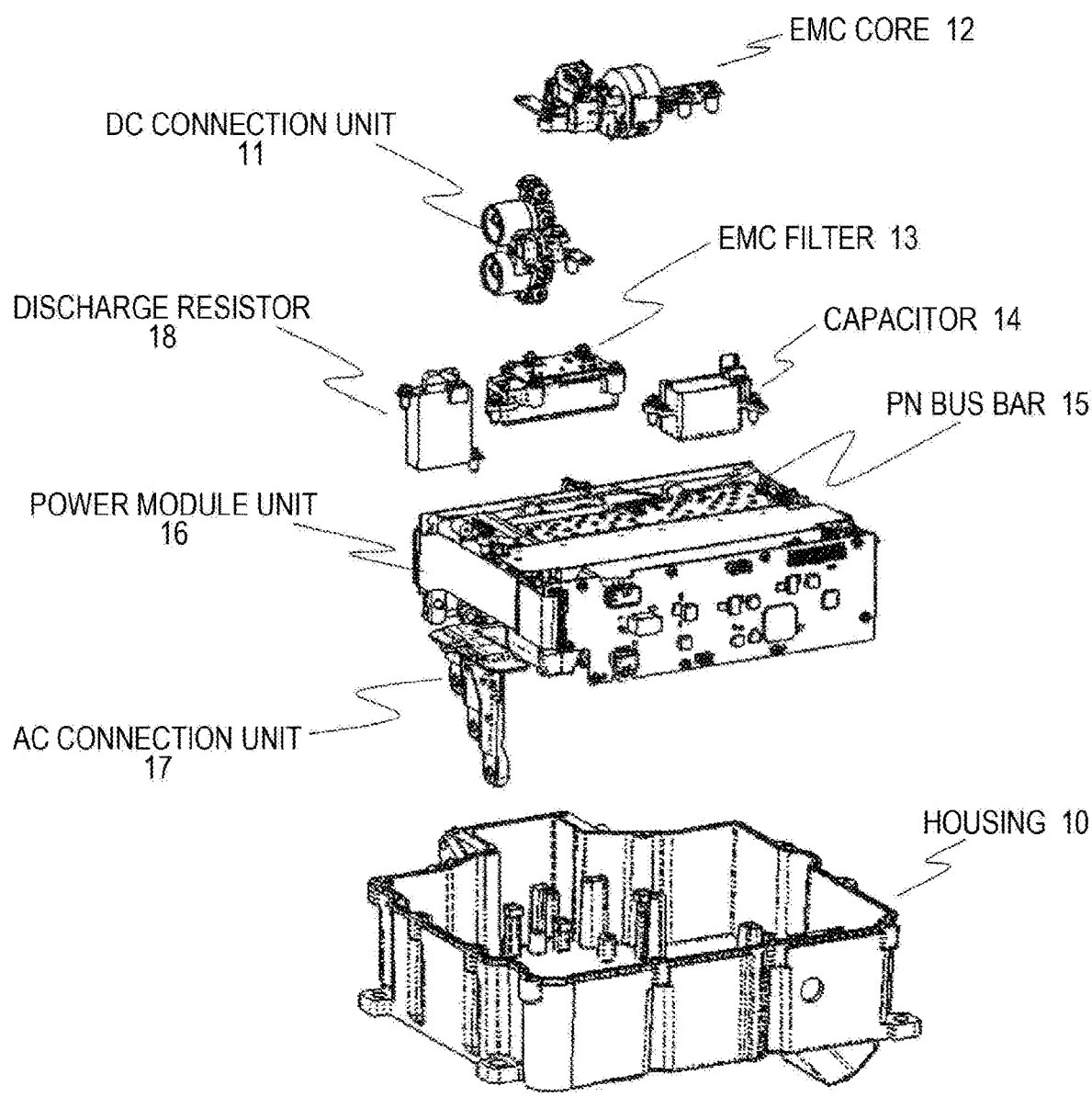
FIG. 2 is a developed view of a power converter 1 according to the present embodiment.
Figure 3:
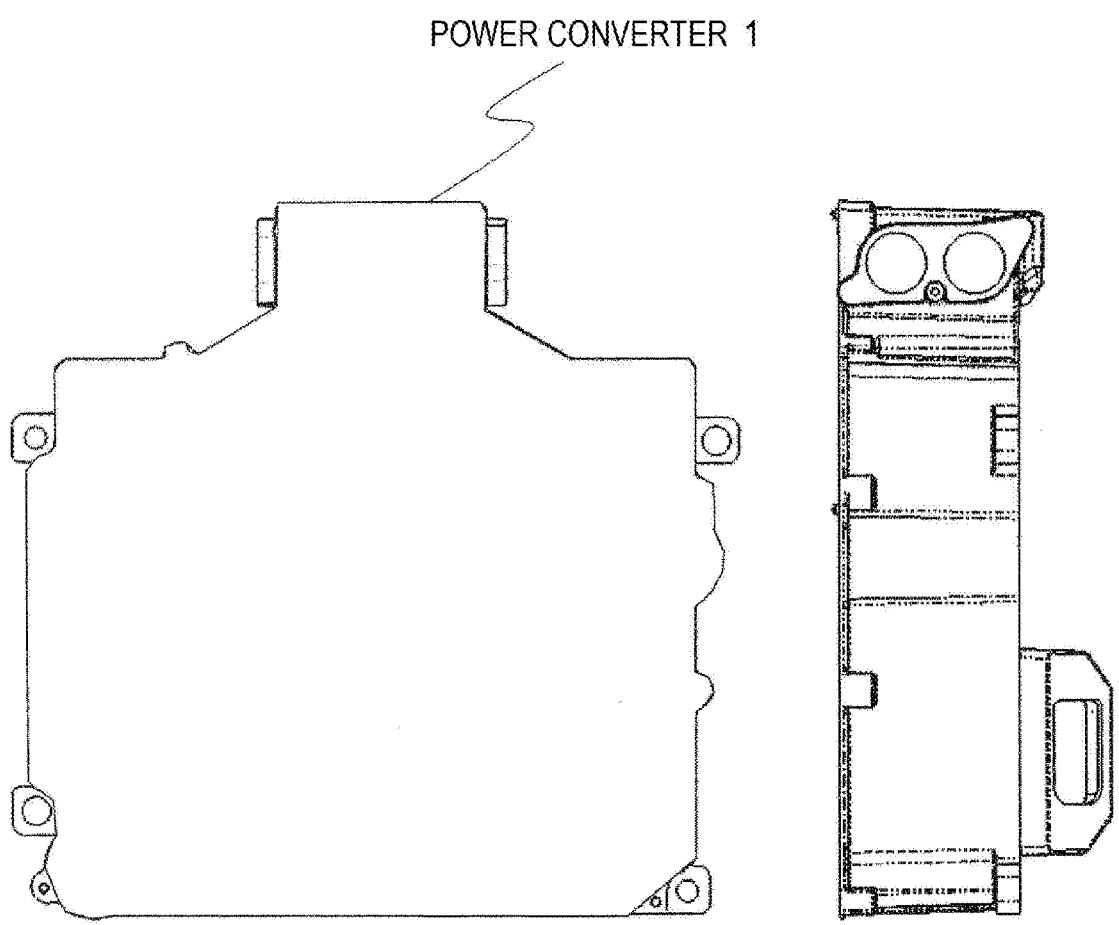
FIG. 3 is an overview of the power converter 1, the left side is a top view and the right side is a side view.

FIG. 2 is a developed view of a power converter according to the present embodiment. FIG. 3 is an overview of the power converter 1, the left side is a top view and the right side is a side view.

A housing 10 accommodates internal components of the power converter 1. A direct current (DC) connection unit inputs and outputs DC power to and from the power converter. An ENC core 12 and an EMC filter 13 suppress electromagnetic noise generated by internal components of the power converter 1.

A power module unit 16 accommodates a semiconductor for converting electric power. The capacitor 14 smoothes electric power when the power module unit 16 converts electric power. A positive negative (PN) bus bar 15 connects a smoothing capacitor and a power module.

An AC connection unit 17 inputs and outputs AC power to and from the power converter. A discharge resistor 18 quickly reduces the voltage when operation of the power converter 1 stops.

Figure 4:
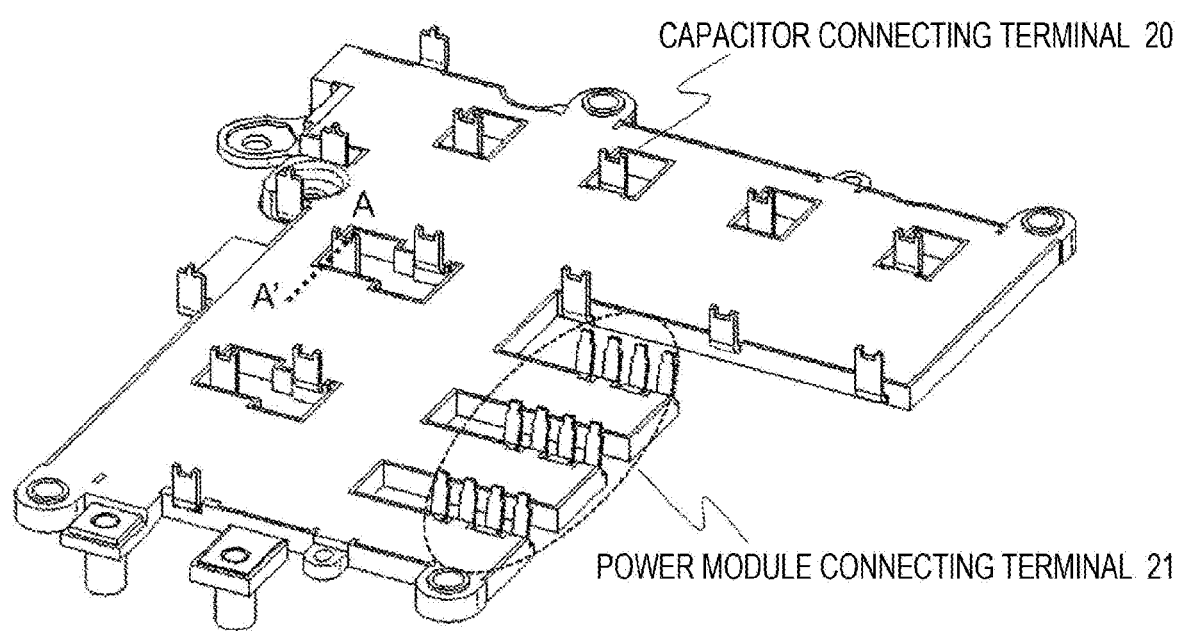
FIG. 4 is an external perspective view of the PN bus bar 15.

FIG. 4 is an external perspective view of the PN bus bar 15.

The PN bus bar 15 includes a positive electrode side conductor 100 and a negative electrode side conductor 101 described later. A capacitor connecting terminal 20 connects the capacitor 14 to the positive electrode side conductor 100 and the negative electrode side conductor 101.

A power module connecting terminal 21 connects the power module unit 16 to the positive electrode side conductor 100 and the negative electrode side conductor 101.

Figure 1:
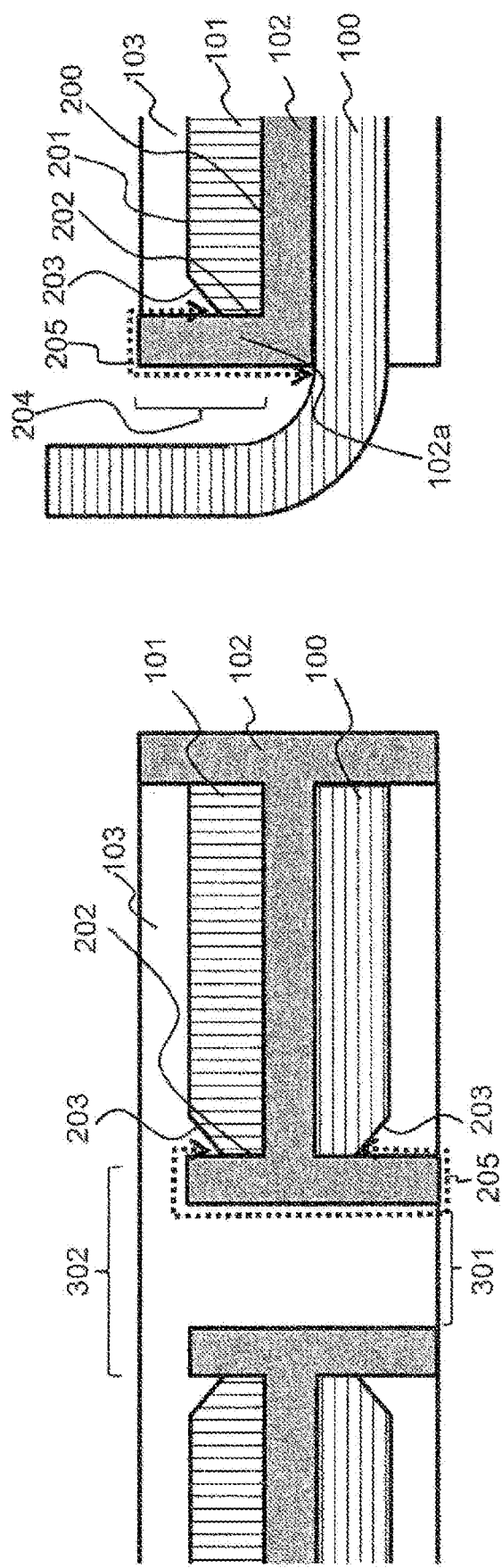
FIG. 1 on the right side is a cross-sectional view of a PN bus bar 15 taken along the line A-A in FIG. 4, and FIG. 1 on the left side is a cross-sectional view when a through hole 301 is formed in the PN bus bar 15.

The right side of FIG. 1 is a cross-sectional view of the PN bus bar 15 taken along the line A-A in FIG. 4, and the left side is a cross-sectional view when a through hole 301 is formed in the PN bus bar 15.

The positive electrode side conductor 100 is applied with a positive side DC voltage, and is connected to a positive electrode terminal of the capacitor 14 and a positive electrode terminal of the power module unit 16. The negative electrode side conductor 101 is applied with a negative side DC voltage, and is connected to a negative electrode terminal of the capacitor 14 and a negative electrode terminal of the power module unit 16.

An insulating member 102 is disposed between the positive electrode side conductor 100 and the negative electrode side conductor 101 to insulate between the positive side DC voltage and the negative side DC voltage. The insulating member 102 forms a wall 102$a$ facing a side surface of the negative electrode side conductor 101.

The negative electrode side conductor 101 includes a contact surface 200 in contact with the insulating member 102, a main surface 201 opposite to the contact surface 200, a side surface 202 facing a protrusion 204, and an inclined surface 203 forming an obtuse angle with respect each of the main surface 201 and the side surface 202.

The protrusion 204 of the insulating member 102 is formed so as to overlap with the side surface 202 and the inclined surface 203 when viewed from a direction perpendicular to the side surface 202.

As a result, since the negative electrode side conductor 100 in contact with the insulating member 102 having the protrusion 204 has the inclined surface 203, the creepage distance can be extended as compared with the case where the inclined surface 203 is not provided, and high reliability for creeping discharge can be obtained. Therefore, since the creepage distance can be extended, high insulation reliability can be secured without increasing size.

A sealing resin material 103 filled between at least the inclined surface 203 and the protrusion 204.

The creepage distance 205 is defined by the distance of the shortest path between contact points with the insulating member 102 of the positive electrode side conductor 100 and the negative electrode side conductor 101 on the insulating member 102. Taking the variations in the adhesion state between the sealing resin material 103 and the insulating member 102 into consideration, the space between the sealing resin material 103 and the insulating member 102 in the shortest path between the positive electrode side conductor 100 and the negative electrode side conductor 103 may not be completely adhered, so that the interface is regarded as the contact surface between insulating materials, that is, the creeping surface.

By providing the sealing resin material 103, it is possible to ignore the space distance between the negative electrode side conductor 101 and the insulating member 102, which exists when the sealing resin material 103 is not provided. The space distance is a distance for a space not through the insulating member and is basically different from the creepage distance. However, the space distance less than the prescribed distance according to the pollution degree of the environment treated as a creepage distance. In this case, the space distance is regarded as a creepage distance shorter than the creepage distance 205 taking a path on the insulating member 102. By providing the sealing resin 103, it is unnecessary to consider the space distance, so that even if the pollution degree is high, it is possible to reliably secure the creepage distance.

Since the negative electrode side conductor 101 in contact with the insulating member 102 having the protrusion 204 has the inclined surface 203, the creepage distance can be extended as compared with the case where the inclined surface 203 is not provided, and high reliability for creeping discharge can be obtained. Therefore, it is possible to obtain high insulation reliability against creeping discharge even in an environment with a high pollution degree.

In the left side of FIG. 1, the insulating member 102 has a cylindrical portion 302 forming the through hole 301, and the sealing resin material 103 seals the positive electrode side conductor 100, the negative electrode side conductor 101, and the insulating member 102, and is filled in the through hole 301.

The cylindrical portion 302 is formed so as to overlap with the side surface 202 and the inclined surface 203 when viewed from a direction perpendicular to the side surface 202.

By forming the inclined surface on the negative electrode side conductor 101 of the cylindrical portion 302 which is a structure for filling the sealing resin, the width of the protrusion of the insulating member 102 can be reduced for the amount of the increased creepage distance, and accordingly, the through hole of the conductor can be reduced so that conduction heat generation of the bus bar can be suppressed. As a result, it is possible to use a low-cost member having low heat resistance temperature, or to improve the output of the power converter.

Figure 5A:
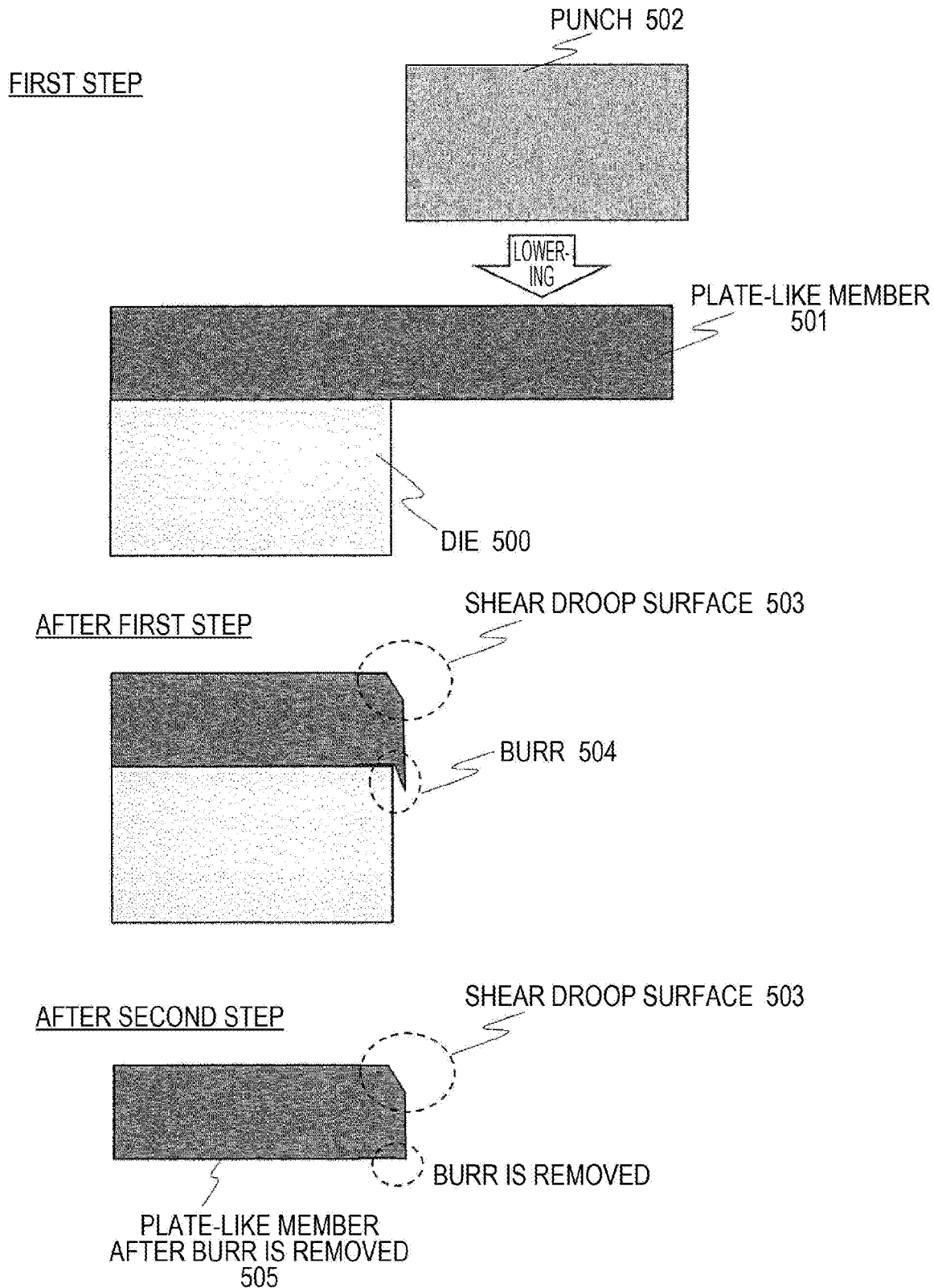
FIG. 5($a$) is a conceptual diagram showing an example of a manufacturing step of the PN bus bar 15.
Figure 5B:
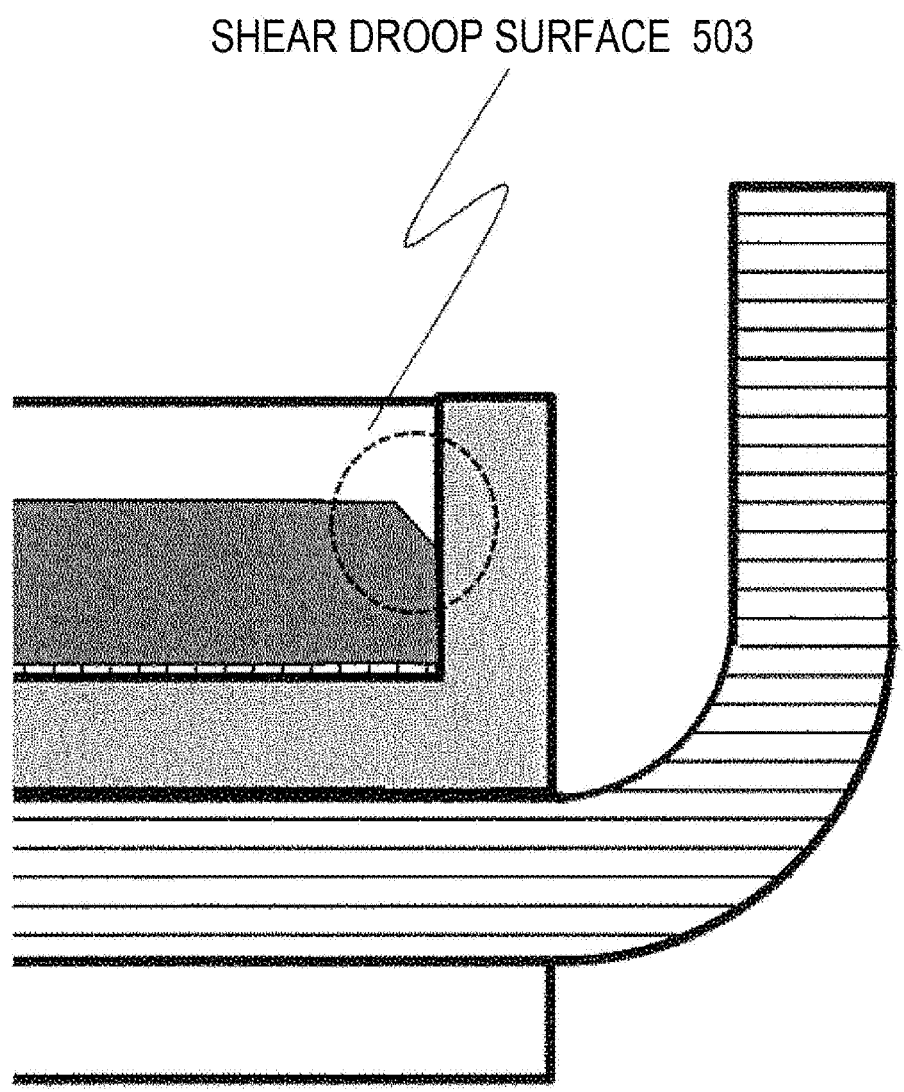

FIG. 5(a) is a conceptual diagram showing an example of a manufacturing step of the PN bus bar 15. FIG. 5(b) is a conceptual view showing the completion of the PN bus bar 15 created by the manufacturing step of FIG. 5(a).

In a first step of FIG. 5(a), a die 500 is a support of a plate-like member 501 to be cut. A punch 503 is a member for lowering the punch 503 and shearing the plate-like member 501.

As shown after the first step of FIG. 5(a), a shear droop surface 503 is an inclined surface formed by deformation of the plate-like member 501 by a downward stress at the time of shearing. Similarly, a burr 504 is a sharp edge portion formed by deformation at the time of shearing.

In a second step of FIG. 5(a), the burr 504 is cut and removed to form the plate-like member 505 after the burr is removed.

In FIG. 5(b), the shear droop surface 503 of the plate-like member 505 after the burr is removed is disposed so as to face the protrusion 204 of the insulating member 102 in FIG. 1. The concrete configuration is such that the inclined surface 203 and the shear droop surface 503 in FIG. 1 are disposed by being regarded as equivalent.

Generally, in order to avoid damage of the insulating member 102 by the burr 504, the shear droop surface 503 is disposed so as to be in contact with the insulating member 102 on the surface in contact with the insulating member 102.

On the other hand, in the present embodiment, the shear droop surface 503 generated during the step is used as the inclined surface 203. For this reason, the burr 504 is removed to obtain a surface in contact with the insulating member 102.

Since this step makes the process of forming the inclined surface 203 unnecessary, an inexpensive power converter can be provided.

In the present embodiment, the shear droop surface 503 in the first step is utilized as the inclined surface 203. However, when an inclined surface is formed in another different step, the surface can of course be used.

Also, as a method of removing the burr 205, cutting removal is taken as an example, but other methods may of course be adopted as long as the burr can be removed.

REFERENCE SIGNS LIST 1 power converter
10 housing
11 DC connection unit
12 EMC core
13 ENC filter
14 capacitor
15 PN bus bar
16 power module unit
17 AC connection unit
18 discharge resistor
20 capacitor connecting terminal
21 power module connecting terminal
100 positive electrode side conductor
101 negative electrode side conductor
102 insulating member

200 contact surface
201 main surface
202 side surface
203 inclined surface
204 protrusion
301 through hole
302 cylindrical portion
500 die
501 plate-like member
503 punch
504 burr
505 plate-like member

The invention claimed is:

1. A manufacturing method of a power converter comprising:
   a first step of cutting a plate-like member to form a positive electrode side conductor or a negative electrode side conductor;
   a second step of removing a burr formed at an end portion of the positive electrode side conductor or the negative electrode side conductor; and
   a third step of disposing the positive electrode side conductor or the negative electrode side conductor such that a surface on a side from which the burr is removed is in contact with an insulating member and a shear droop surface of the positive electrode side conductor or the negative electrode side conductor faces a protrusion formed in the insulating member.

2. A power converter comprising:
   a positive electrode side conductor;
   a negative electrode side conductor; and
   an insulating member disposed between the positive electrode side conductor and the negative electrode side conductor,
      wherein the positive electrode side conductor or the negative electrode side conductor includes:
         a main surface on a side opposite to a surface in contact with the insulating member,
         a side surface connected to the surface in contact with the insulating member, and
         an inclined surface forming an obtuse angle with respect to each of the main surface and the side surface, wherein the inclined surface and the main surface are formed on a side of the conductor opposite to a side facing the other conductor as viewed in a direction perpendicular to the side surface, and
      the insulating member includes a protrusion formed so as to overlap with the side surface and the inclined surface as viewed in the direction perpendicular to the side surface.

3. The power converter according to claim 2, wherein the inclined surface is a shear droop surface formed when the positive electrode side conductor or the negative electrode side conductor is cut.

4. The power converter according to claim 2, wherein each of the positive electrode side conductor and the negative electrode side conductor includes:
   a main surface on a side opposite to a surface in contact with the insulating member,
   a side surface connected to the surface in contact with the insulating member, and
   an inclined surface forming an obtuse angle with respect to each of the main surface and the side surface, wherein the inclined surface and the main surface are formed on a side opposite to the other conductor.

5. The power converter according to claim 2, further comprising a sealing resin material filled between at least the inclined surface and the protrusion.

6. The power converter according to claim 5, wherein the positive electrode side conductor is disposed at a position facing the negative electrode side conductor with the insulating member interposed therebetween,
   the insulating member includes a cylindrical portion forming a through hole,
   the sealing resin material seals the positive electrode side conductor, the negative electrode side conductor, and the insulating member and fills in the through hole, and
   the cylindrical portion is formed so as to overlap the side surface and the inclined surface as viewed from the direction perpendicular to the side surface.

* * * * *